United States Patent [19]
Donner et al.

[11] Patent Number: 4,828,162
[45] Date of Patent: May 9, 1989

[54] MOVING JAW REFLOW SOLDERING HEAD

[75] Inventors: Joseph E. Donner, Vista; Wayne P. Jensen, San Marcos, both of Calif.

[73] Assignee: Hughes Aircraft Company, Los Angeles, Calif.

[21] Appl. No.: 161,862

[22] Filed: Feb. 29, 1988

[51] Int. Cl.[4] .................. B23K 1/12; B23K 3/00
[52] U.S. Cl. ..................... 228/6.2; 228/47; 228/51; 228/191; 228/180.2; 269/156; 269/111; 269/21; 29/743; 29/762
[58] Field of Search .............. 228/6.2, 8, 47, 51, 228/264, 191, 180.2; 269/156, 111, 21; 29/743, 762, 825-834

[56] References Cited

U.S. PATENT DOCUMENTS

| | | | |
|---|---|---|---|
| 3,230,338 | 1/1966 | Kawecki | 219/85 |
| 3,382,564 | 5/1968 | Gallentine | 29/471.1 |
| 3,529,760 | 9/1970 | Hickman et al. | 228/51 |
| 3,576,969 | 5/1971 | Surty | 219/221 |
| 3,632,973 | 1/1972 | O'Keefe | 219/230 |
| 3,649,809 | 3/1972 | Halstead | 219/228 |
| 3,673,384 | 6/1972 | Burman et al. | 219/230 |
| 3,700,155 | 10/1972 | Hermanns | 228/3 |
| 3,746,239 | 7/1973 | Auray | 228/19 |
| 3,791,018 | 2/1974 | Johnston et al. | 29/471.1 |
| 3,804,320 | 4/1974 | Vandermark | 228/19 |
| 3,813,023 | 5/1974 | Auray et al. | 228/19 |
| 3,883,945 | 5/1975 | Wallis | 228/176 |
| 3,887,783 | 6/1975 | Comette | 219/85 |
| 3,990,863 | 11/1976 | Palmer | 29/203 |
| 4,013,208 | 3/1977 | Mason et al. | 228/44.1 A |
| 4,022,370 | 5/1977 | Durney | 228/5.1 |
| 4,034,202 | 7/1977 | Vandermark | 219/230 |
| 4,084,315 | 4/1978 | Michaels | 29/740 |
| 4,135,630 | 1/1979 | Snyder et al. | 228/6.2 |
| 4,136,444 | 1/1979 | Durney | 29/764 |
| 4,255,644 | 3/1981 | Delorme | 219/233 |
| 4,295,596 | 10/1981 | Doten et al. | 228/180 A |
| 4,300,715 | 11/1981 | Keizer et al. | 228/180 A |
| 4,381,601 | 5/1983 | Tamai et al. | 29/740 |
| 4,399,610 | 8/1983 | Moyer | 228/180.2 |
| 4,431,474 | 2/1984 | Gronek et al. | 156/583.1 |
| 4,436,242 | 3/1984 | Shisler et al. | 228/264 |
| 4,500,032 | 2/1985 | Ackerman | 228/180.2 |
| 4,507,861 | 4/1985 | Sprenkle | 29/741 |
| 4,518,110 | 5/1985 | Breske et al. | 228/20 |
| 4,521,959 | 6/1985 | Sprenkle | 29/741 |
| 4,528,746 | 7/1985 | Yoshimura | 29/743 |
| 4,552,300 | 11/1985 | Zovko et al. | 228/20 |
| 4,599,037 | 7/1986 | Ross, Jr. et al. | 414/752 |
| 4,607,782 | 8/1986 | Mims | 228/180.2 |
| 4,614,858 | 9/1986 | Vial | 219/230 |
| 4,654,507 | 3/1987 | Hubbard et al. | 219/233 |
| 4,694,570 | 9/1987 | Rudolph et al. | 29/740 |
| 4,696,096 | 9/1987 | Green et al. | 29/829 |

FOREIGN PATENT DOCUMENTS

| | | | |
|---|---|---|---|
| 1943393 | 3/1971 | Fed. Rep. of Germany | 228/191 |
| 24776 | 2/1980 | Japan | 228/180.2 |
| 82444 | 6/1980 | Japan | 228/6.2 |
| 471966 | 9/1975 | U.S.S.R. | 228/6.2 |
| 670399 | 6/1979 | U.S.S.R. | 228/6.2 |
| 912421 | 3/1982 | U.S.S.R. | 228/6.2 |
| 2185432 | 7/1987 | United Kingdom | 228/180.2 |

Primary Examiner—Nicholas P. Godici
Assistant Examiner—Samuel M. Heinrich
Attorney, Agent, or Firm—Joseph E. Szabo; Anthony W. Karambelas

[57] ABSTRACT

Apparatus for gripping and removing integrated circuits, including four heatable jaws movable into gripping relation with soldered integrated circuit leads. The heatable jaws are mounted to respective leveler plates, each of which is suspended from a base member by a pivotable gripper arm and three flexure arms. Individual air cylinders are selectively actuable to pivot the gripper arms and thereby achieve inward motion and gripping action of the jaws. A second embodiment employs a cam follower mechanism rather than air cylinders to actuate similarly-mounted jaw elements.

14 Claims, 8 Drawing Sheets

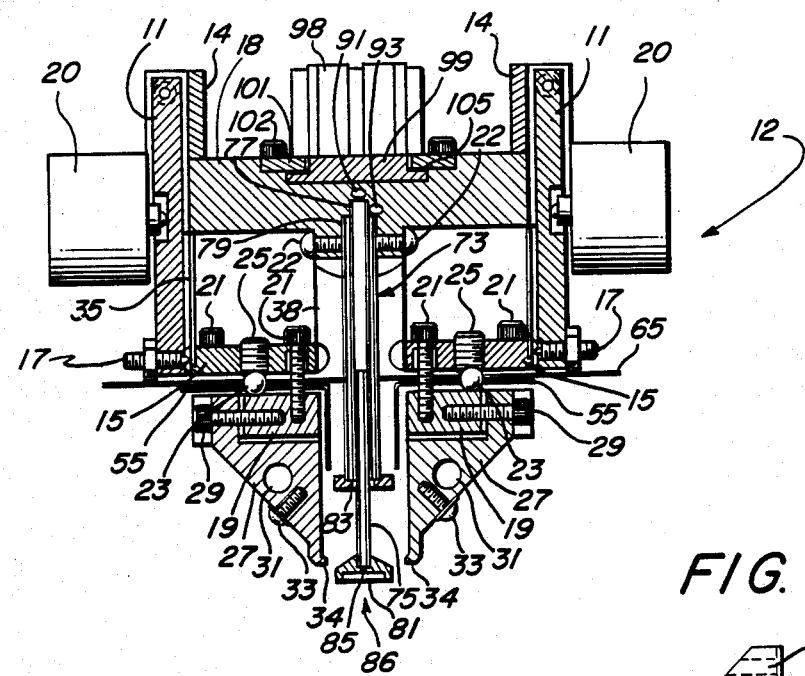
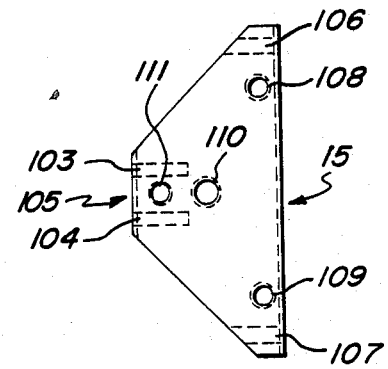
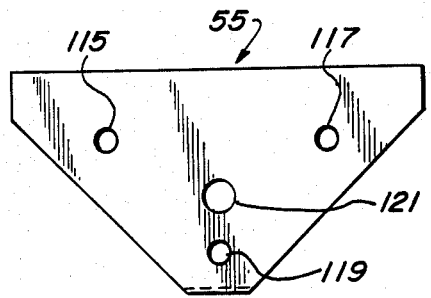
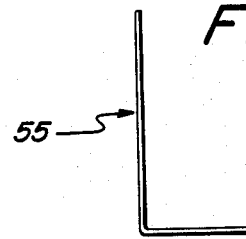

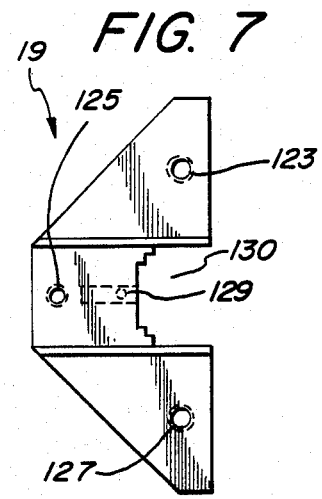
FIG. 7
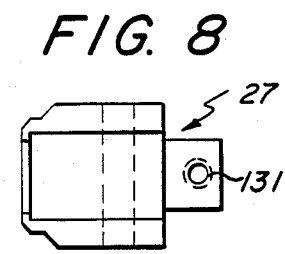
FIG. 8
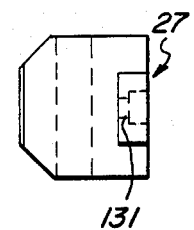
FIG. 9
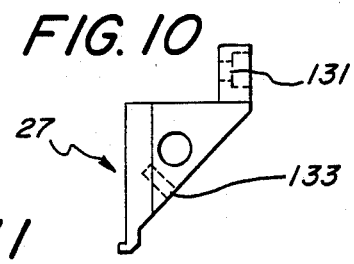
FIG. 10
FIG. 11
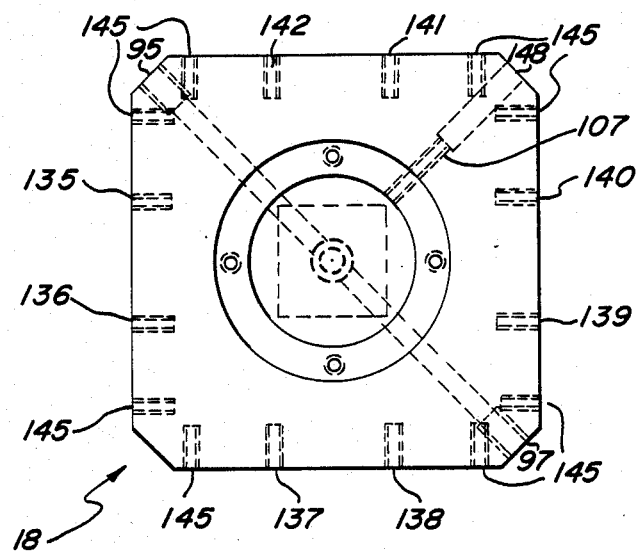
FIG. 12
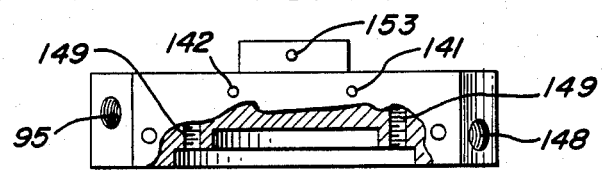

MOVING JAW REFLOW SOLDERING HEAD

BACKGROUND OF THE INVENTION

1. Field of the Invention

The subject invention relates to soldering and integrated circuit technology, and particularly to apparatus for remelting solder and removing an installed integrated circuit.

2. Description of the Prior Art

Elegant applications of soldering technology have proliferated with the advent of modern electronics. Although the art of joining metals by soldering is centuries old, a deep scientific understanding of the metallurgy and the many different ways of introducing heat to the joint are relatively modern. Electronic components have advanced from components with two leads, like resistors and capacitors, to integrated circuits with 10 to 100 or more leads. The leads on integrated circuits typically emerge from the body of the IC from two or four of the sides of the device. On a "through-hole" device, the leads come out the sides and then bend downward with sufficient length that they project beyond the bottom of the device so that they may pass through holes in printed circuit boards. On a "gull-wing" device, the leads effectively project outward and away from the sides. The leads are formed in such a way that they will come in contact with the top surface of a printed circuit board for surface mounting. On a "J-lead" device, the leads come out the sides, bend down the sides and then may tuck under the bottom of the device. These, too, are surface-mounted devices.

Each of the leads of an IC needs to be soldered to a printed circuit board or otherwise connected to other electronic parts to become a useful part of a system. This joining process may be handled one joint at a time with a small diameter soldering iron, or some means of soldering more than one lead at a time may be devised. Mass joining processes such as wave soldering, infrared radiant soldering, and vapor phase soldering have been developed to reduce assembly time.

A problem occurs, however, when an integrated circuit fails. A failed circuit must be removed and replaced without causing damage to the neighboring parts. Removal of ICs having leads on only two sides is relatively easy. However, it becomes increasingly difficult with four-sided integrated circuits, sometimes referred to as "quad packs." Successful removal of quad packs requires that all of the leads be heated simultaneously until all of the solder becomes liquid. The mass joining processes of wave soldering, infrared radiant soldering, and vapor phase soldering have not adapted well to circuit removal, because it is desired to remelt the leads on only one component, the integrated circuit (IC), while not remelting the other solder joints of other components on an assembly.

The task of removing a single IC while leaving other components undisturbed, has been accomplished by producing localized heat via streams of focused hot gas, typically air, and by specially-shaped soldering iron tips which make contact with the appropriate surfaces of the IC and the printed circuit board (PCB). Hot gas can successfully be applied in the removal of through-hole, gull-wing, and J-lead devices, but it is often criticized because there is spillover of the hot gas to nearby components, which is deemed undesirable. Shaped soldering iron tips have been successfully used for removal of through-hole and gull-wing devices because they can readily make contact with the device leads and the PCB pads. They have not been noted for success in removing J-leaded devices due to poor thermal contact A heated, nonmoving collet has also been devised which can be made to properly fit gull-wing devices An integral vacuum probe can be used to lift gull-wing devices after the solder is melted if there are no other restraints such as glue or conformal coating.

SUMMARY OF THE INVENTION

It is therefore an object of the invention to provide improved apparatus for removing integrated circuits from printed circuit boards to which they are soldered;

It is another object of the invention to provide such apparatus adaptable to a variety of integrated circuit types such as J-lead and gull-wing devices;

It is another object of the invention to provide integrated circuit removal apparatus with improved gripping and removal capabilities;

It is another object of the invention to provide integrated circuit removal apparatus which minimizes adverse effects on components adjacent an integrated circuit being removed; and It is another object of the invention to provide apparatus particularly suited for removal of quad packs.

According to the invention, an integrated circuit removal apparatus employs a heatable jaw for each side of an IC, which effectively creates a cavity about the IC. Each heatable jaw is movable in toward the sides of the IC to deliver localized heat to the sides of the device and the PCB. To accomplish removal, for example, of J-lead devices, the cavity formed by the jaws is brought down around the IC so that one face f each jaw makes contact with the plane of the PCB. After this contact, the jaws are caused to move toward the sides of the IC until they make contact with the vertical portions of the leads. Since the jaws are likely to make their initial contact with solid solder, the downward and inward forces must typically be maintained through the liquefaction process. The inward and downward motion of the jaws ceases when all of the solder has liquefied and the jaws are halted by the solid, nonmelting leads of the IC and the pads of the PCB. When the solder has melted on all of the IC leads, the vertical component of force is reversed while the inward force is maintained to effectively grasp the device during the lifting phase of the cycle. If desired, a rotary motion may be applied in order to break any adhesive which might have been placed between the bottom of the IC and the PCB.

The apparatus according to the invention makes it possible to simultaneously apply heat to the sides of a single IC and to a PCB, without applying excessive heat to nearby components. Heat can be efficiently applied to only those surfaces which must be heated. The apparatus of the invention additionally facilitates selective heating and removal of J-lead devices because it provides excellent thermal contact with the PCB pads and the sides of the IC. The apparatus also can grip the device with a force greater than that provided by a vacuum pickup, thereby making it easier to overcome the forces of glue or conformal coating.

BRIEF DESCRIPTION OF THE DRAWINGS

The just-summarized preferred embodiment will now be described in detail in conjunction with the drawings, of which:

FIG. 3 is a side section view of the preferred embodiment taken along section 3—3 of FIG. 2;

FIG. 4 is a top view of a leveler plate according to the preferred embodiment;

FIG. 5 is a top view of a lower heat shield according to the preferred embodiment;

FIG. 6 is a side view of the lower heat shield of FIG. 5;

FIG. 7 is a top view of a shoe according to the preferred embodiment;

FIG. 8 is a front view of a jaw according to the preferred embodiment;

FIG. 9 is a top view of the jaw of FIG. 8;

FIG. 10 is a side view of the jaw of FIG. 9;

FIG. 11 is a top view of the base plate of the preferred embodiment;

FIG. 12 is a side, partially cutaway view of the base plate of FIG. 11;

DETAILED DESCRIPTION OF THE PREFERRED EMBODIMENT

Figure 1:
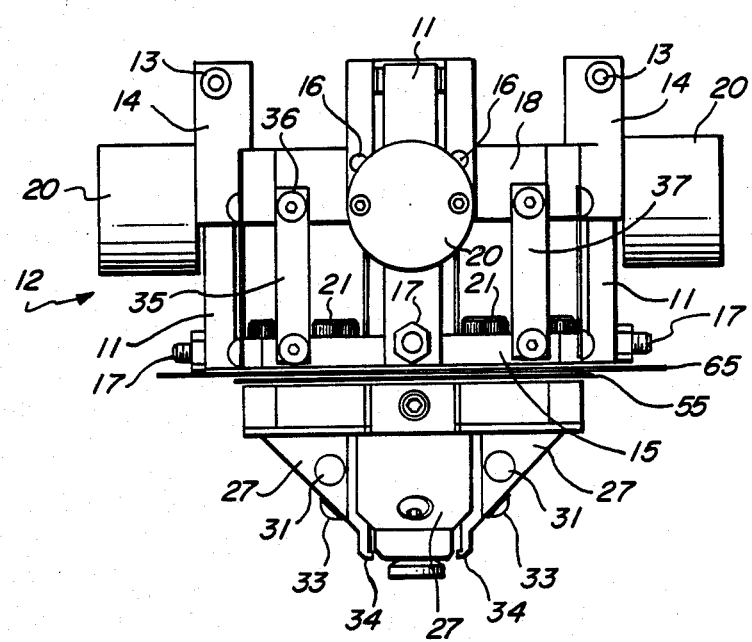
FIG. 1 is a side view of the integrated circuit removal apparatus of the preferred embodiment.
Figure 2:
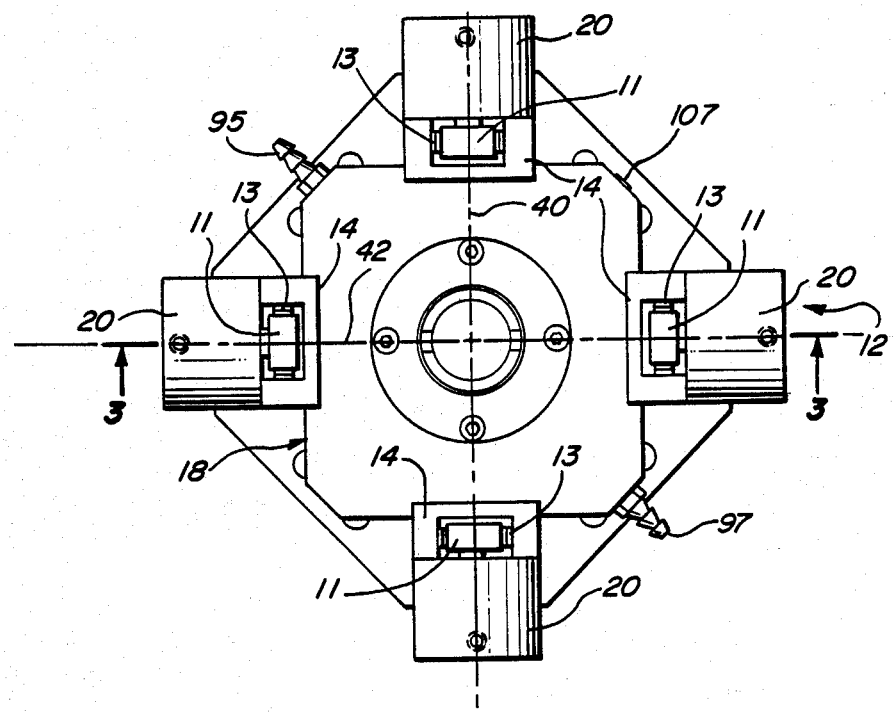
FIG. 2 is a top view of the integrated circuit removal apparatus of the preferred embodiment.

As shown in FIGS. 1-3, the preferred embodiment comprises a gripper unit 12, which is typically mounted to a weld head mechanism which positions the gripper unit 12. The gripper unit 12 includes four gripper arms 11, each pivotally mounted by a roller bearing 13 to an upright pivot mount 14. The pivot mount is screwed via screws 16 into a base plate 18. Each gripper arm 11 is activated by a respective air cylinder 20, which is also screwed into the base plate 18. The range of gripper arm motion is approximately 0.125 inch.

As illustrated in the sectional view of FIG. 3, each gripper arm 11 includes a set screw 17 whose point abuts and pushes against a respective leveler plate 15. The set screws 17 provide a fine tuning adjustment to move the leveler plate 15 in and out slightly to accommodate slight variations in IC size on the order of 20/1000 to 30/1000-inch.

The leveler plate 15 is attached to a shoe 19 by three screws 21. A ball bearing 23 (FIG. 3) is positioned between the shoe 19 and a set screw 25 threaded in the leveler plate 15. The three screws 21 around the ball bearing 23 provide a leveling adjustment of the jaw 27 with respect to work surface 34 so that each jaw may be made flat and parallel to the circuit board.

A jaw 27 is attached to each shoe 19 by a screw 29. A heater element 31 and a thermocouple 33 are attached to each jaw 27. The lower end 34 of each jaw 27 is appropriately shaped to grip an integrated circuit package. In the embodiment shown, the lower end 34 is provided with a projection designed to grip a J-lead device. In the preferred embodiment, each jaw end forms one side of a rectangle and thus may move in and grip a substantially square, rectangular, or two-sided IC package.

As seen in FIG. 1, respective outside flexure arms 35, 37 are attached between the leveler plate 15 and the base plate 18. A middle inner flexure arm 38 is attached between the apex 105 (FIG. 4) of the leveler plate 18 and the base plate 18. Each outside flexure arm 35, 37 is parallel to the inner flexure arm 38 and attached using the leveler plate holes 103, 104 shown in FIG. 4. The flexure arms 35, 37, 38 are constructed of spring steel of a thickness of 20/1000-inch. The arms 35, 37, 38 essentially suspend and hinge the leveler plate 15 at three points and provide and maintain parallelism between the leveler plate 15 and the base plate 18.

As seen in the top view of FIG. 2, pairs of the gripper arms 11 are located directly opposite one another and are symmetrically located about perpendicular center lines 40, 42 such that the jaws 27 may come together to form a square or rectangle.

The operation of the foregoing structure may be briefly described as follows: The jaws 27 are first in an open state. The gripper unit 12 is then lowered by cooperating positioning apparatus so that the jaws 27 are positioned on the pads of the circuit board about the IC to be picked up. The air cylinders 20 are then appropriately activated, forcing the gripper arms 11 to pivot about the axes of their respective bearings 13. The gripper arms 11 in turn push the leveler plates 15 and the attached shoes 19 inward, simultaneously closing the jaws 27 about the integrated circuit package. If desired, only a pair of the air cylinders 20 need be activated, such that an IC with leads on two sides may be grasped and removed.

In order to protect the structure from heat damage, a lower heat shield 55 of "L"-shaped cross-section is mounted about each shoe 19. An upper heat shield 65 is mounted above the lower heat shield 55. The upper heat shield 65 is a substantially square plate with appropriate apertures to accommodate various structural elements of the device which must pass through it. The upper and lower heat shields 55, 65 may be fabricated of 316 stainless steel. Without appropriate heat shielding, heat would take the temper out of various metal members, ruin springs in the device, melt plastic tubing and air cylinder 0-rings, and transfer up to and damage the weld head mechanism mounting the device.

Within the jaw-activating structure is located a cooling air and vacuum pickup structure 73. This structure employs three concentric tubes 75, 77, 79. The first spring tube 75 mounts a vacuum quill 86. The spring tube 75 permits spring-loaded vertical movement of the vacuum quill 86 as it comes into contact with an integrated circuit package, and provides an inner passage 85 through which a vacuum may be applied to the orifice 81 of the vacuum quill 86. The second and third concentric tubes 77, 79 form an annular passage 83 through which an air purge is applied to cool the tubes 75, 77, 79, in order to prevent the spring of the spring tube 75 from losing its temper and to assist in solidifying solder. A vacuum is applied to the inner passage 85 through an inner port 91, while purge air is supplied to the annular passage 83 through a second inner port 93. The inner ports 91, 93 are supplied through respective external ports 95, 97 (FIG. 2).

A coupler 98 is employed to provide for rotation about the central axis of the gripper device 12 in order to align the gripper jaws 27 to a circuit board. The coupler 98 includes a flanged end 99 which is retained by a clamping collar 101 fastened in place by four screws 102. A wave washer 105 is also employed to facilitate rotation. A set screw 107 (FIG. 11) locks the rotation of the gripper unit 12 with respect to the coupler 98.

FIGS. 4–7 illustrate the generally triangular structure of the sequentially attached leveler plate 15, lower heat shield 55 and shoe 19. As may be appreciated, four sets of leveler plates 15, lower heat shields 55 and shoes 9 are employed in the preferred embodiment for four-sided devices. Two gripper arms may be employed for certain two-sided devices.

FIG. 4 illustrates screw holes 103, 104 at the apex 105 of the leveler plate 15, which accommodate screws which attach one of the middle inner flexure arms 38. Also shown are three threaded screw holes 108, 109, 111 near each corner of the leveler plate 15, which accept the screws 21 (FIGS. 1, 3). Another threaded screw hole 110 accommodates the set screw 25.

The heat shield of FIGS. 5 and 6 also includes unthreaded holes 115, 117, 119 through which the screws 21 pass. The other hole 121 accommodates the ball bearing 23.

The shoe 19 of FIG. 7 contains three threaded holes 123, 125, 127, which receive respective ones of the screws 21. The screw hole 129 in the cutout area 130 of the shoe 19 accepts the screw 29, which attaches one of the jaws 27 to the shoe 19. The screw 29 threads through a hole 131 in the jaw 27 as shown in FIGS. 8 and 9. A screw hole 133 (FIG. 10) in each jaw 27 mounts one of the thermocouple attachment screws 33 shown in FIG. 3.

The base plate 18 is shown in further detail in FIGS. 11 and 12. Respective pairs of screw holes 135, 136; 137, 138; 139, 140; and 141, 142 are provided to receive the screws 16 which attach the upright pivot mounts 14. Near each corner 144 are located threaded holes 145 which receive screws 36 attaching the parallel outside flexure arms 35, 37. The cutaway area of FIG. 12 particularly shows successive inner cylindrical bores which receive the flanged end 99 and clamping collar 101, as well as the threaded holes 149 which receive the screws 102 of FIG. 3. FIG. 11 further shows a diagonal bore 148 which receives a set screw 107 for locking the rotation of the gripper flange 99 of the coupler 98. The threaded hole 153 of FIG. 12 receives one of the four screws 22 of FIG. 3, which attach the inner flexure arms 38.

Figure 13A:
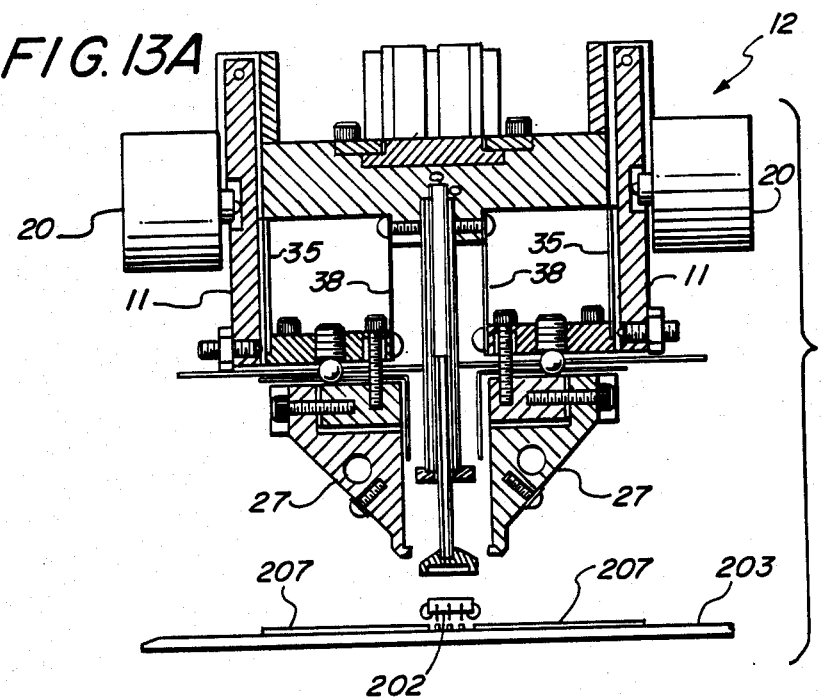
FIGS. 13A though 13E illustrate operation of the preferred embodiment.
Figure 13B:
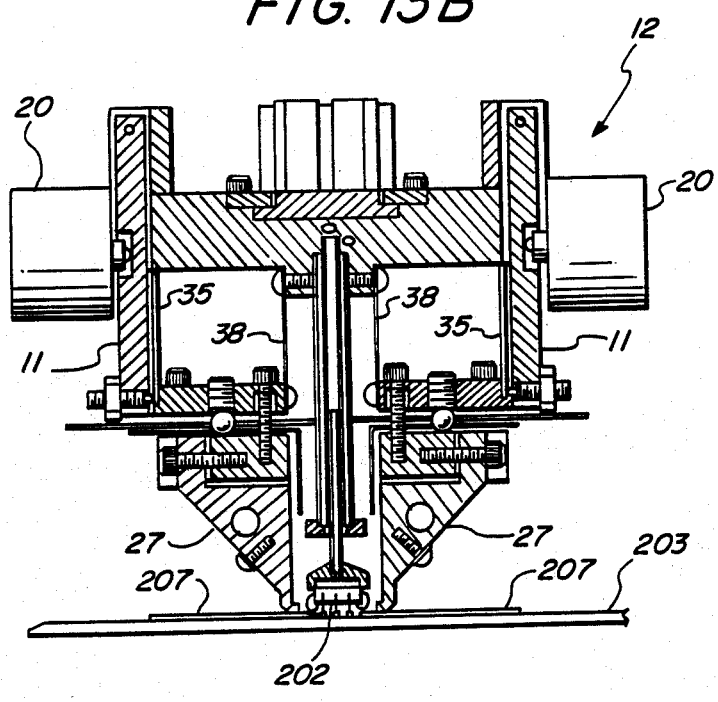

To accomplish removal, the soldering head 12 of the preferred embodiment is positioned over an IC 202 to be removed, as shown in FIG. 13A. The cavity formed by the four heater jaws 27 is then brought down around the IC 202 so that one face of each jaw 27 makes contact with the plane of the printed circuit board (PCB) 203, as shown in FIG. 13B. In the particular application shown, the jaws 27 actually touch down on pads 207 on the PCB 203. The air purge is on at all times, and the vacuum apparatus is activated upon touchdown on the PCB 203.

Figure 13C:
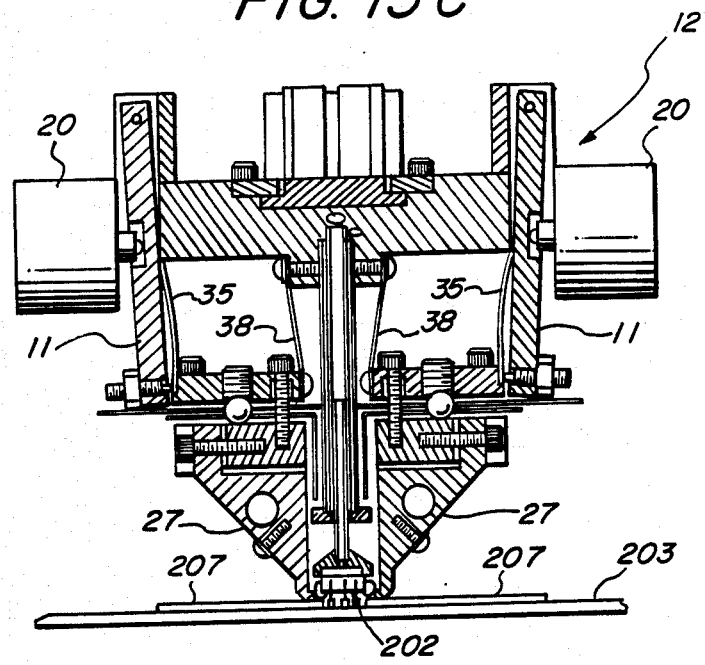

After contact with the PCB 203, the air cylinders 20 are activated, causing the jaws 27 to move toward the sides of the IC 202 until they make contact with the vertical portions of the leads, as shown in FIG. 13C. FIG. 13C particularly shows the pivoted position of the gripper arms 11 and flexing of the flexure arms 35, 37, 38. Since the jaws 27 are likely to make their initial contact with solid solder, the downward and inward forces must typically be maintained through the liquefaction process. The inward and downward motion of the jaws 27 ceases when all of the solder has liquefied and the jaws 27 are halted by the solid, nonmelting leads of the IC 202 and the pads 207 of the PCB 203.

Figure 13D:
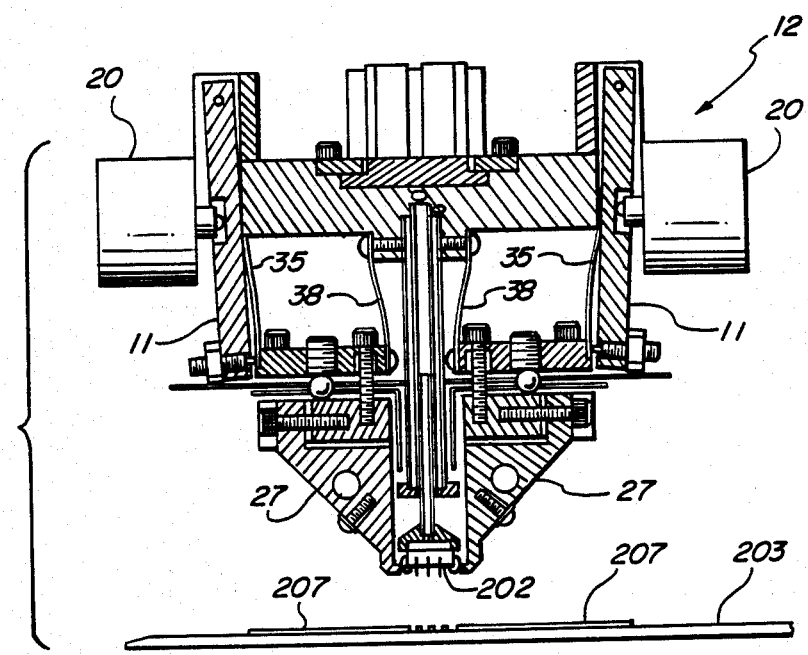

When the solder has melted on all of the IC leads, the vertical component of force on the soldering head 12 is reversed, while the inward force is maintained to effectively grasp the device 202 during the lifting phase of the cycle, illustrated in FIG. 13D. Further, it may or may not be desirable, or required, to apply a rotary motion to the soldering head 12 in order to break any adhesive which might have been placed between the bottom of the IC 202 and the PCB 203.

Figure 13E:
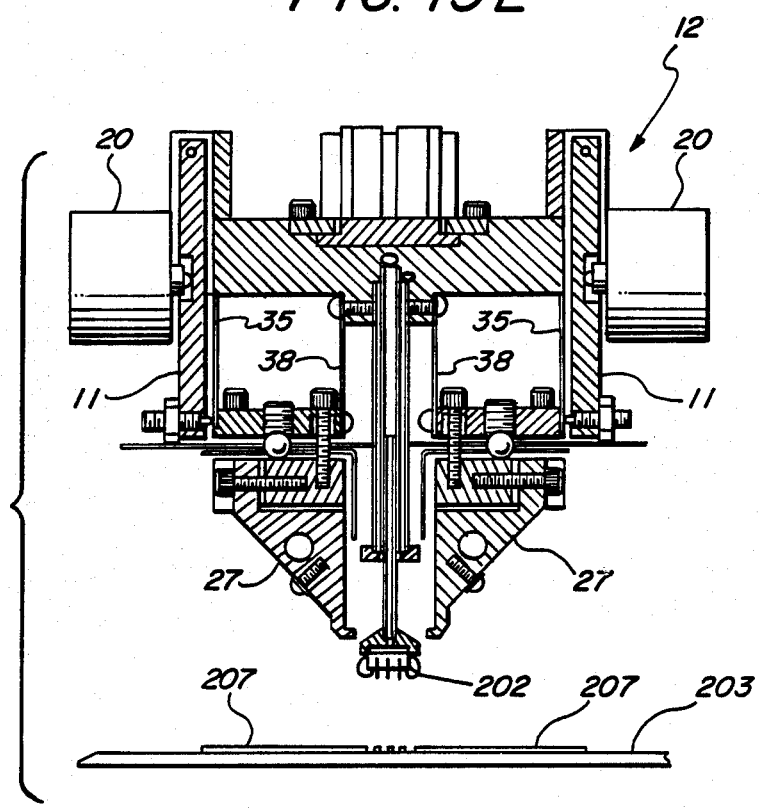

During melting of the solder, the jaws 27 are closed upon the IC 202. They remain closed until the IC 202 is removed from the PCB 203 and the mechanism reaches its upper limit. At the upper limit, the jaws 27 are opened and the IC 202 is held only by vacuum, as shown in FIG. 13E. The opening of the jaws, FIG. 13E, removes the IC 202 from direct thermal contact with the heating surfaces.

FIGS. 13A–E particularly illustrate removal of a J-lead device. In removal of gull wing devices, gripping action of the jaws 27 is not typically necessary. Instead, the jaws 27 typically may be touched down against the leads of the gull wing device, heat applied, and the circuit removed by the vacuum cup 86.

The vacuum remains on during solder melting and during IC liftoff. When the head 12 is at its upper limit, the chip 202 is held by the vacuum apparatus. The vacuum remains on until the operator removes the IC 202 from the vacuum cup 86. After the IC 202 is removed, air can flow into the vacuum port, which causes the actuation of a flow switch (not shown). Actuation of the flow switch causes the vacuum to be turned off.

Figure 14:
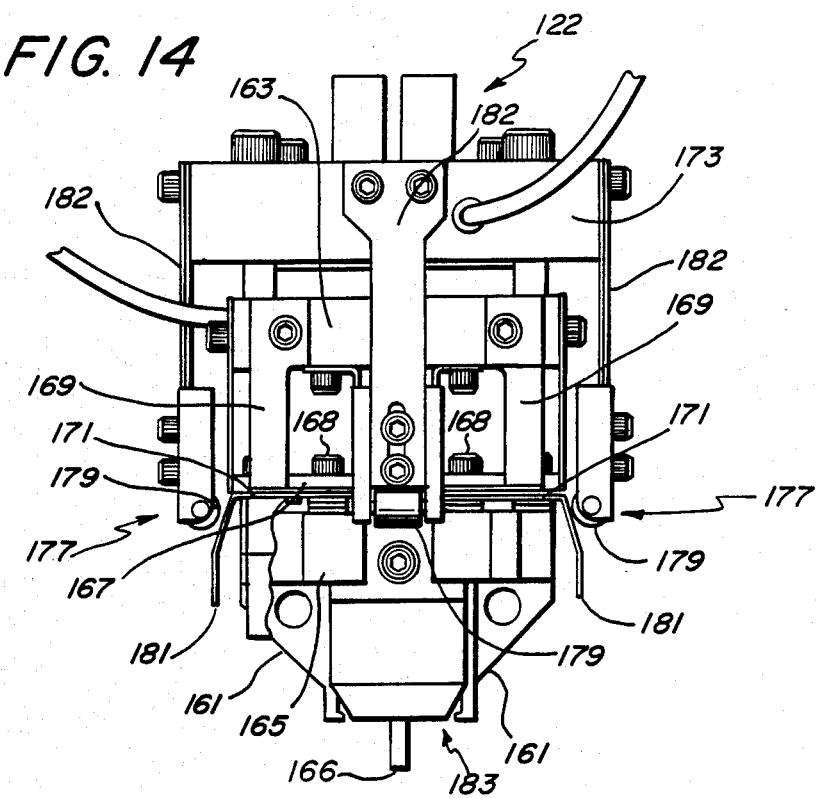
FIG. 14 is a side view of an alternate embodiment.
Figure 15:
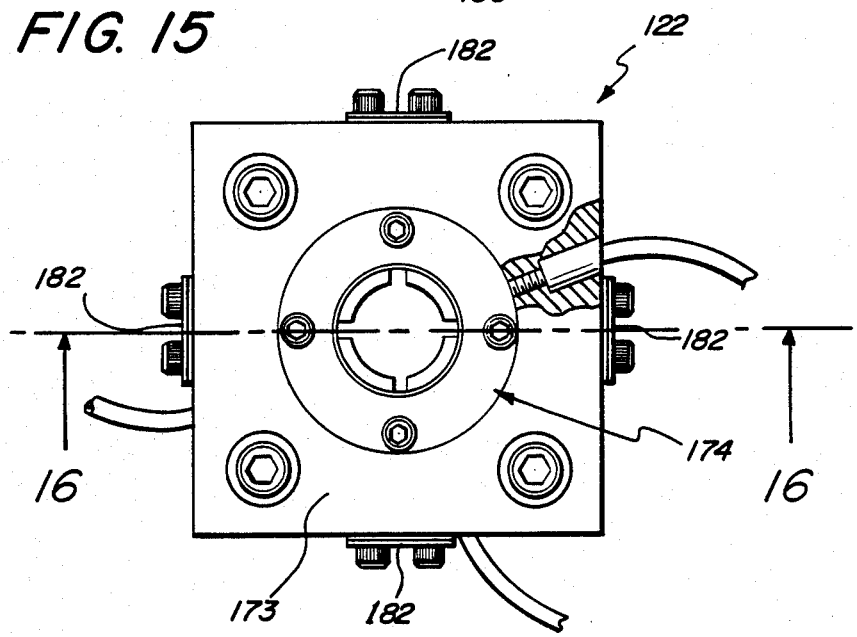
FIG. 15 is a top view of an alternate embodiment.
Figure 16:
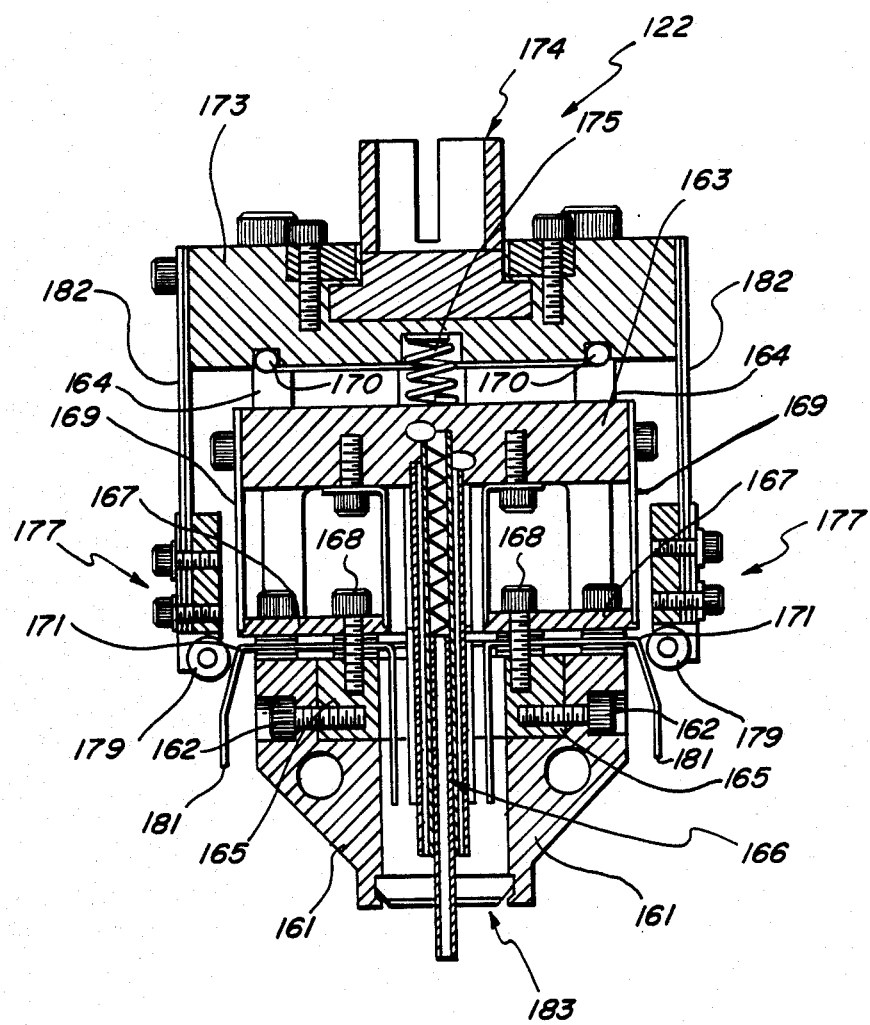
FIG. 16 is a side sectional view of the alternate embodiment taken along line 16—16 of FIG. 15.

An alternative embodiment soldering head 122 is illustrated in FIGS. 14–16. This embodiment is similar in some respects to the preferred embodiment, but employs a cam follower mechanism to close four jaw members about an integrated circuit package. Similar to the preferred embodiment, four jaws 161 are each suspended from a lower plate 163. Each jaw 161 is attached by screws 162 to a shoe 165, which is attached to a leveling plate 167 by screws 168. Each leveling plate 167 is suspended by three flexure arms 169 from a lower plate 163. In this embodiment, the flexure arms 169 are spot welded to the leveler plates 167. Four heat shields 171, similar to lower heat shields 55, are also provided between each shoe 165 and its associated leveling plate 167. A vacuum pickup mechanism 166, identical to that of the preferred embodiment, is also shown.

The lower plate 163 is mounted to move vertically upward with respect to a base plate 173 utilizing four shoulder screws and bearings 164. A spring 175 biases the lower plate 163 at a distance away from the base plate 173, and an O-ring 170 is provided to provide a seal to maintain gripping action during circuit removal. A collar mechanism 174, similar to that of the preferred embodiment, is also provided.

The base plate 173 mounts four leaf springs 182, each of which extends down the middle of each side of the device. Each leaf spring 182 mounts a cam follower 177, which mounts rollers 179. Each roller 179 is positioned to contact a rigid extension 181 of a respective heat shield 171 upon downward vertical motion of the roller 179. The extensions 181 serve as cam surfaces to create inward motion of the jaws 161.

In operation of the embodiment of FIGS. 14–16, the soldering head 122 moves down until the lower portion of the head 183 is stopped by contact with the PCB. The base plate 173 is somewhat independent and continues downward for a short distance to make a seal between the O-ring 170 and the top of the lower plate 163. Then the vacuum is turned on to maintain gripping action on the integrated circuit. The additional motion of the base plate 173 is converted into inward forces by action of the leaf spring mounted rollers 179 contacting the cam surfaces on extensions 181. These inward forces serve to cause the jaws 161 to securely grasp a four-sided integrated circuit while heat is applied and the IC removed as in the preferred embodiment.

In both of the embodiments just described, the vertical motion of the soldering heads 12, 122 preferably is accomplished via an air cylinder mounted along the vertical axis, as known in the art. In the preferred embodiment, the inward force, however, is provided by four (or two), short stroke air cylinders 20 which are mounted near each of the moving jaws 27. It may also be noted that while the embodiments are particularly suited to circuit removal, they also could find application in insertion apparatus.

As is apparent, many modifications and adaptations of the preferred embodiment can be made without departing from the scope and spirit of the invention. Therefore, it is to be understood that, within the scope of the appended claims, the invention may be practiced other than as specifically described herein.

What is claimed is:

1. An apparatus for use in removing integrated circuits from a supporting surface to which they are attached by soldering of leads, comprising:
   a frame means;
   four movable jaw means for grasping an integrated circuit about the soldered leads, and for melting solder used to attach the integrated circuit;
   means for suspending each said jaw means from said frame means and for moving said jaw means during said melting operation through melted solder toward said leads while maintaining application of gripping force on said integrated circuit; and
   four leveler plate means, one for attaching each said jaw means to said means for suspending and moving and for adjusting the position of each said jaw means with respect to said supporting surface.

2. The apparatus of claim 1 wherein said means for suspending and moving comprises:
   a plurality of gripper arms attached through pivot joints to said frame means; and
   means for pivoting the gripper arms toward or away from said integrated circuit.

3. The apparatus of claim 2 wherein each said leveler plate means comprises:
   a triangular leveler plate;
   a shoe attached by screws to said triangular leveler plate;
   a ball bearing mounted between a respective jaw means and said triangular leveler plate; and
   screw means for attaching one end of the respective jaw means to said leveler plate and retaining said ball bearing therebetween.

4. The apparatus of claim 3 wherein each jaw means tapers down to a projection on the end opposite the one mounted by said screw means to the respective triangular leveler plates.

5. The apparatus of claim 4 further including means for fine tuning the position of each said jaw means to accommodate different-sized integrated circuits.

6. The apparatus of claim 2 wherein said pivoting means comprises:
   a plurality of air cylinder means, one connected to each gripper arm, for pivoting said gripper arms; and
   a plurality of flexure arm means attached between said frame means and each said leveler plate means for maintaining parallelism of said leveler plates means with respect to said frame means.

7. The apparatus of claim 1 wherein said apparatus further includes:
   a heating element in each said jaw means; and
   means for controlling the temperature produced by each said heating element.

8. The apparatus of claim 1 further including:
   a vacuum quill means for contacting and applying a vacuum directly to the integrated circuit; and
   means for mounting said vacuum quill on said frame means and permitting vertical movement of said vacuum quill with respect to said frame means as said vacuum quill comes in contact with the integrated circuit.

9. Apparatus for grasping electronic devices positioned with respect to a supporting surface, comprising:
   a base plate means;
   at least first and second oppositely disposed gripper arms;
   means for pivotally mounting said gripper arms on said base plate means;
   at least first and second oppositely disposed jaw means for gripping a said electronic device;
   leveler plate means for attaching each said jaw means to a respective gripper arm and for adjusting the position of the respective said jaw means with respect to said supporting surface; and
   means actuable for pivoting each of said gripper arms toward each other and causing said jaw means to grasp said electronic device.

10. The apparatus of claim 9 wherein said means actuable for pivoting comprises first and second air cylinders.

11. The apparatus of claim 9 wherein said leveler plate means comprises:
    a leveler plate attached to a respective gripper arm; and
    a mounting shoe attached to each said leveler plate and to a respective one of said first and second jaw means.

12. The apparatus of claim 11 wherein said means for pivotally mounting comprises an upright pivot mount extending above said base plate means.

13. The apparatus of claim 12 further including first, second and third flexure arm means for suspending each said leveler plate from said base plate means.

14. The apparatus of claim 13 wherein each said leveler plate is substantially triangular in shape and wherein each of said flexure arm means is attached to said leveler plate near an angle of said triangular shape.

* * * * *